(12) United States Patent
Urano

(10) Patent No.: US 9,419,357 B2
(45) Date of Patent: Aug. 16, 2016

(54) CONNECTOR ASSEMBLY

(71) Applicant: Japan Aviation Electronics Industry, Ltd., Tokyo (JP)

(72) Inventor: Tetsu Urano, Tokyo (JP)

(73) Assignee: JAPAN AVIATION ELECTRONICS INDUSTRY, LTD., Tokyo (JP)

( * ) Notice: Subject to any disclaimer, the term of this patent is extended or adjusted under 35 U.S.C. 154(b) by 0 days.

(21) Appl. No.: 14/779,105

(22) PCT Filed: Dec. 27, 2013

(86) PCT No.: PCT/JP2013/007666
§ 371 (c)(1),
(2) Date: Sep. 22, 2015

(87) PCT Pub. No.: WO2014/155469
PCT Pub. Date: Oct. 2, 2014

(65) Prior Publication Data
US 2016/0056556 A1   Feb. 25, 2016

(30) Foreign Application Priority Data

Mar. 28, 2013 (JP) ................. 2013-068639

(51) Int. Cl.
| | |
|---|---|
| H01R 12/00 | (2006.01) |
| H01R 12/70 | (2011.01) |
| H01R 12/73 | (2011.01) |
| H01R 13/05 | (2006.01) |
| H01R 13/11 | (2006.01) |

(52) U.S. Cl.
CPC ........ *H01R 12/7076* (2013.01); *H01R 12/7011* (2013.01); *H01R 12/732* (2013.01); *H01R 13/055* (2013.01); *H01R 13/113* (2013.01)

(58) Field of Classification Search
CPC .......................... H01R 9/096; H01R 13/65802
USPC .................. 439/65, 607, 609, 76.1, 108, 101
See application file for complete search history.

(56) References Cited

U.S. PATENT DOCUMENTS 5,620,340 A * 4/1997 Andrews .............. H01R 23/688
                                                                439/108
5,664,968 A * 9/1997 Mickievicz .......... H01R 23/688
                                                                439/607.1

(Continued)

FOREIGN PATENT DOCUMENTS

| JP | 2001-068184 A | 3/2001 |
| JP | 2007-109595 A | 4/2007 |

(Continued)

OTHER PUBLICATIONS

International Search Report from corresponding PCT/JP2013/007666 issued Feb. 4, 2014; 4pgs.

*Primary Examiner* — Phuongchi T Nguyen
(74) *Attorney, Agent, or Firm* — Maier & Maier, PLLC

(57) ABSTRACT

A connector assembly includes a receptacle mounted on a first connector mounting surface of a first substrate; a receptacle mounted on a second connector mounting surface of a second substrate; and a relay connector. The relay connector includes a plug to be mated with the receptacle in a direction parallel to the first connector mounting surface; a plug to be mated with the receptacle in a direction parallel to the second connector mounting surface; and a handle that couples the plug and the plug to each other. The relay connector is structured such that a first mating direction in which the plug is mated to the receptacle is substantially the same as a second mating direction (Q) in which the plug is mated to the receptacle.

20 Claims, 15 Drawing Sheets

(56) References Cited

U.S. PATENT DOCUMENTS

| | | | | |
|---|---|---|---|---|
| 6,116,926 A | * | 9/2000 | Ortega | H01R 13/6471 439/108 |
| 6,184,460 B1 | * | 2/2001 | Bertoncini | H01R 13/65807 174/359 |
| 6,220,896 B1 | * | 4/2001 | Bertoncini | H01R 23/688 439/607.1 |
| 6,431,914 B1 | * | 8/2002 | Billman | H01R 23/688 439/607.07 |

FOREIGN PATENT DOCUMENTS

| | | |
|---|---|---|
| JP | 3156133 U | 12/2009 |
| JP | 2012-199173 A | 10/2012 |
| JP | 2012-243462 A | 12/2012 |

* cited by examiner

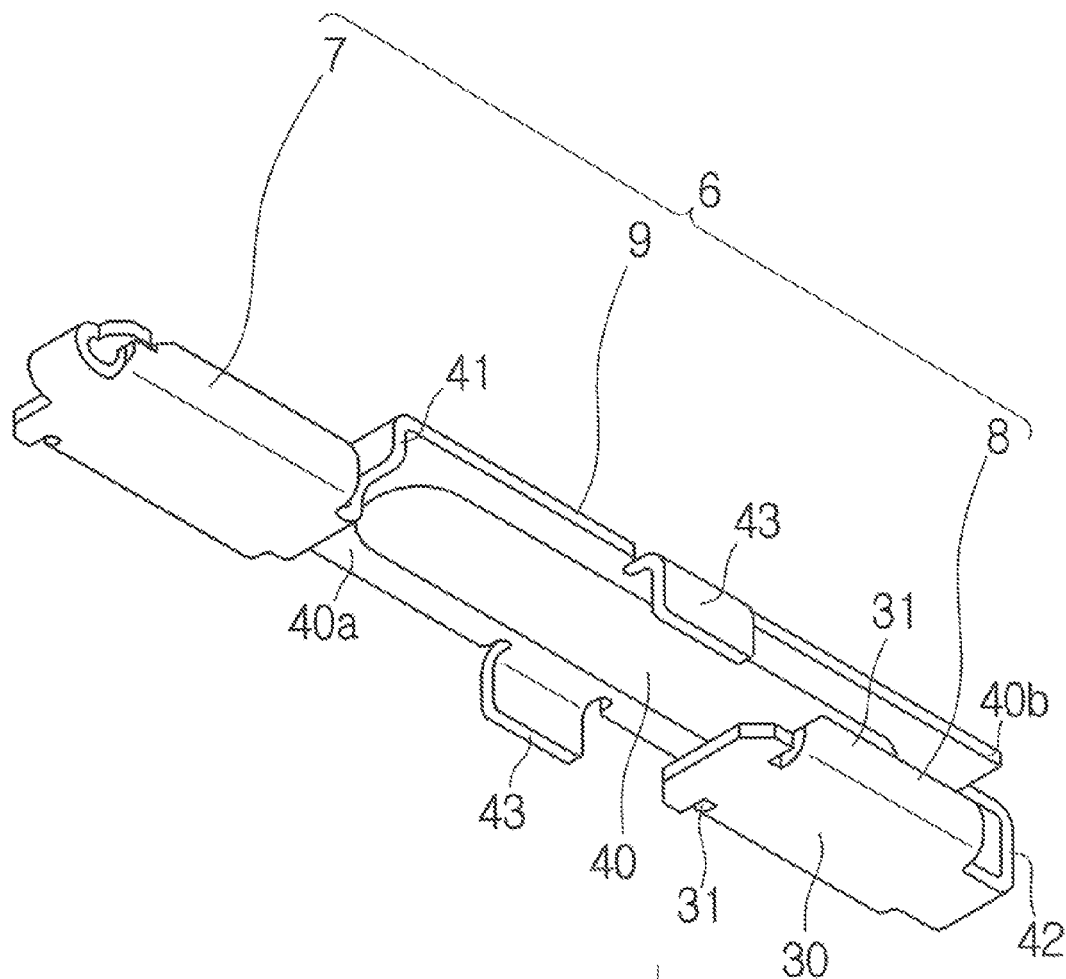
Fig. 11
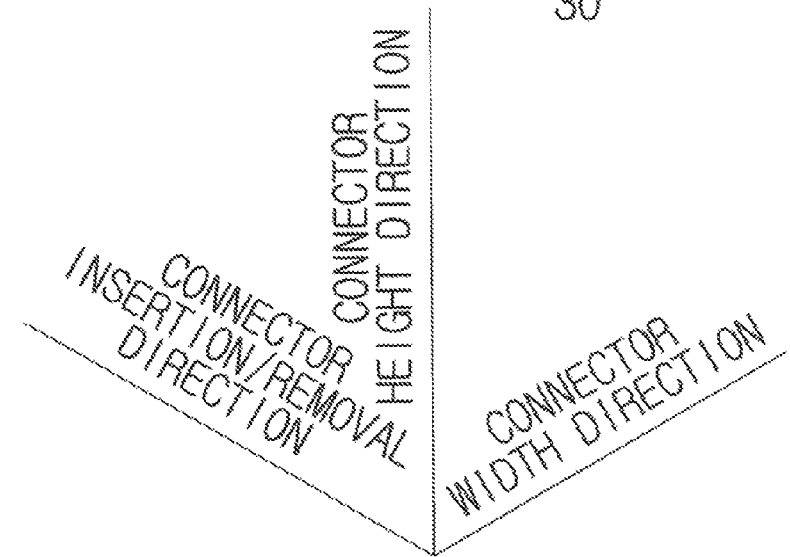

CONNECTOR ASSEMBLY

CROSS-REFERENCE TO RELATED APPLICATIONS

This application claims priority to Japanese Patent Application No. 2013-068639, filed Mar. 28, 2013; and International Patent Application No. PCT/JP2013/007666, filed Dec. 27, 2013, the entire contents of which are hereby incorporated by reference.

TECHNICAL FIELD

The present invention relates to a connector assembly.

BACKGROUND ART

As a technique of this type, Patent Literature 1 discloses an LED substrate electric connection device 102 that electrically and mechanically connects an LED substrate 100 and an LED substrate 101 to each other as shown in FIG. 15 of this application. The LED substrate electric connection device 102 includes a first connector 103 which is mounted on the LED substrate 100, and a second connector 104 which is mounted on the LED substrate 101. The first connector 103 includes a first terminal 105 which is elongated and extends along a direction parallel to the surface of the LED substrate 100. The second connector 104 includes a second housing 106 having an opening into which the first terminal 105 of the first connector 103 is inserted.

CITATION LIST

Patent Literature

[Patent Literature 1] Japanese Unexamined Patent Application Publication No. 2012-243462

SUMMARY OF INVENTION

Technical Problem

In the above-described structure disclosed in Patent Literature 1, the direction in which the first connector 103 and the second connector 104 are mated with each other is parallel to the surface of the LED substrate 100. Accordingly, the LED substrate electric connection device 102 enables a low profile and strong holding power.

However, in order to mate the first connector 103 with the second connector 104, it is necessary that the first terminal 105 of the first connector 103 greatly protrude from the LED substrate 100. If the first terminal 105 of the first connector 103 greatly protrudes from the LED substrate 100, special care should be taken in handling the LED substrate 100, on which the first connector 103 is mounted, prior to mating of the connectors, so as not to damage the first connector 103 mounted on the LED substrate 100.

Therefore, it is an object of the present invention to provide a technique that facilitates handling of a connector assembly, which connects one substrate to another substrate, prior to mating of connectors, while achieving a low profile and strong holding power of the connector assembly.

Solution to Problem

According to an aspect of the present invention, a connector assembly is provided which connects a first substrate having a first connector mounting surface and a second substrate having a second connector mounting surface to each other in such a manner that the first connector mounting surface and the second connector mounting surface are substantially parallel to each other, the connector assembly including: a first connector mounted on the first connector mounting surface of the first substrate; a second connector mounted on the second connector mounting surface of the second substrate; and a third connector including: a first connector portion to be mated with the first connector in a direction parallel to the first connector mounting surface; a second connector portion to be mated with the second connector in a direction parallel to the second connector mounting surface; and a coupling portion that couples the first connector portion and the second connector portion to each other, the third connector being structured in such a manner that a first mating direction in which the first connector portion is mated to the first connector is substantially the same as a second mating direction in which the second connector portion is mated to the second connector.

The coupling portion includes a coupling portion main body that is elongated and extends in the first mating direction. The first connector portion is formed so as to protrude in the first mating direction from a leading end of the coupling portion main body in the first mating direction. The second connector portion is formed so as to protrude in the first mating direction from a trailing end of the coupling portion main body in the first mating direction.

The second connector portion is located between the coupling portion main body and the second substrate in a state where the first substrate and the second substrate are connected to each other by the connector assembly.

The second connector includes an accommodating portion having a tubular shape and extending along the first mating direction. The second connector portion is inserted into the accommodating portion of the second connector, and is thereby mated with the second connector.

The coupling portion includes a pair of communication guide pieces that sandwich the accommodating portion of the second connector prior to the insertion of the second connector portion into the second connector, so as to guide the insertion of the second connector portion into the second connector.

The pair of communication guide pieces is formed so as to protrude toward the second substrate from the coupling portion main body.

The first connector and the third connector are each formed of a metal. The first connector includes a tubular accommodating portion into which the first connector portion of the third connector is inserted. A claw portion is formed at the first connector portion of the third connector. An engaging portion that engages with the claw portion is formed at the accommodating portion of the first connector. The first connector portion of the third connector is inserted into the accommodating portion of the first connector, thereby allowing the claw portion to engage with the engaging portion.

The first connector portion of the third connector includes a cantilever-shaped lock spring piece. The claw portion is formed at the lock spring piece.

The first connector portion of the third connector includes a pair of side plates opposed to each other.

The lock spring piece is formed between the pair of side plates.

The lock spring piece is disposed at a position closer to one of the pair of side plates. A key insertion gap is formed between the lock spring piece and the other one of the pair of side plates.

An improper insertion prevention protrusion to be inserted into the key insertion gap is formed at the accommodating portion of the first connector.

The improper insertion prevention protrusion is formed by lancing from a part of a peripheral wall of the accommodating portion of the first connector.

A lock hole is formed in the peripheral wall of the accommodating portion of the first connector. The engaging portion is formed on an inner peripheral surface of the lock hole.

The improper insertion prevention protrusion is formed by lancing during formation of the lock hole.

A blocking plate is formed at an open end of the accommodating portion of the first connector, the open end being opposite to an open end of the accommodating portion of the first connector through which the first connector portion of the third connector is inserted.

The accommodating portion of the first connector includes a cantilever-shaped contact spring piece.

A shape retaining mechanism that retains the shape of the tubular accommodating portion of the first connector is formed at a joint of the accommodating portion of the first connector formed into a tubular shape by plate bending. The shape retaining mechanism is implemented by a shape retaining protrusion and a shape retaining protrusion accommodating portion in which the shape retaining protrusion is accommodated.

The accommodating portion of the first connector is formed into a rectangular tubular shape.

The first connector further includes an accommodation guide piece that guides insertion of the first connector portion of the third connector into the accommodating portion of the first connector.

Advantageous Effects of the Invention

According to the present invention, it is possible to facilitate handling of a connector assembly, which connects one substrate to another substrate, prior to mating of connectors, while achieving a low profile and strong holding power of the connector assembly.

BRIEF DESCRIPTION OF DRAWINGS

FIG. 11 is a perspective view of the relay connector viewed from another angle.

DESCRIPTION OF EMBODIMENTS

Embodiments of the present invention will be described below with reference to FIGS. 1 to 14.

Figure 1:
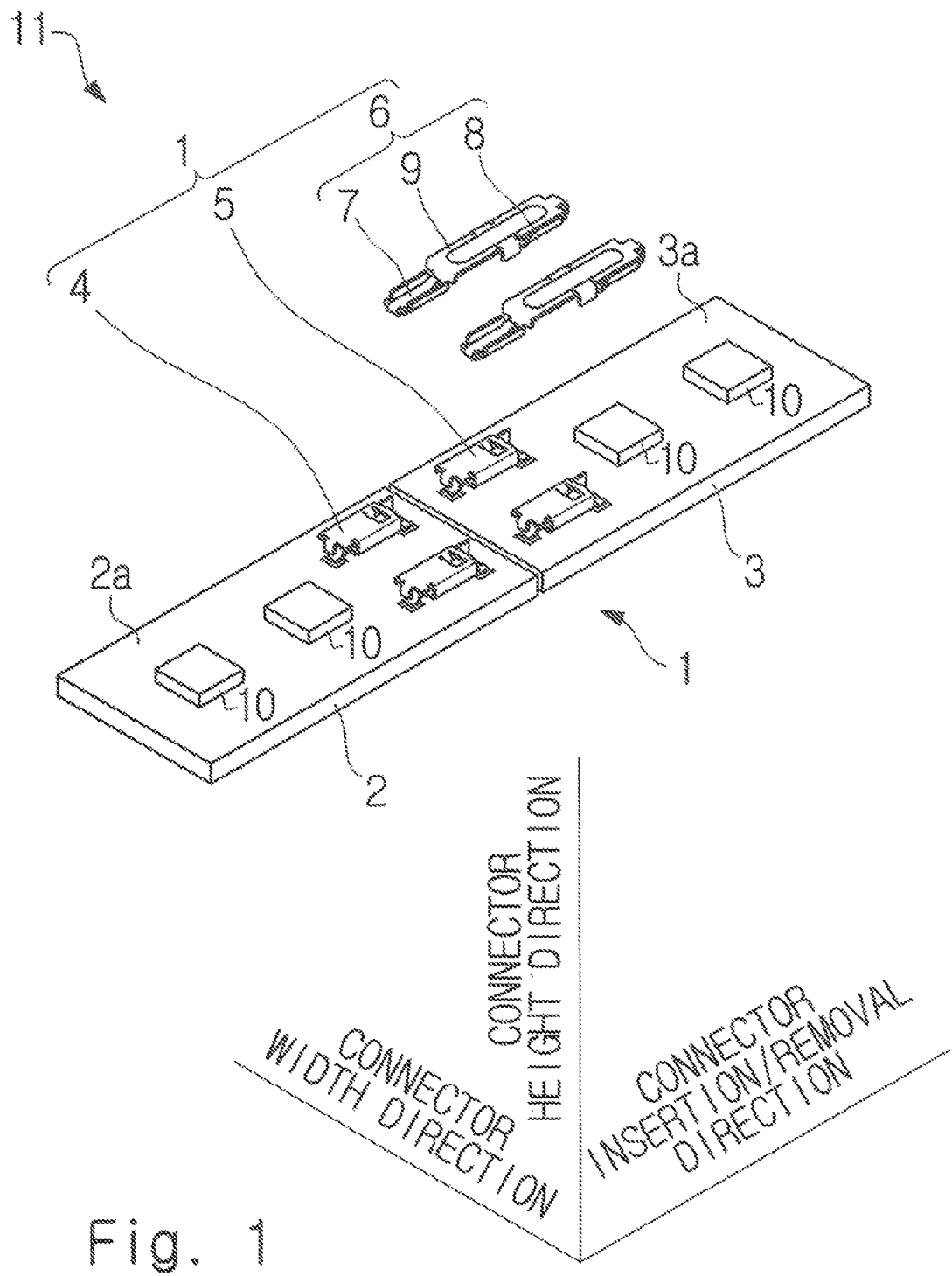
FIG. 1 is a perspective view of a connector assembly prior to mating of connectors.
Figure 2:
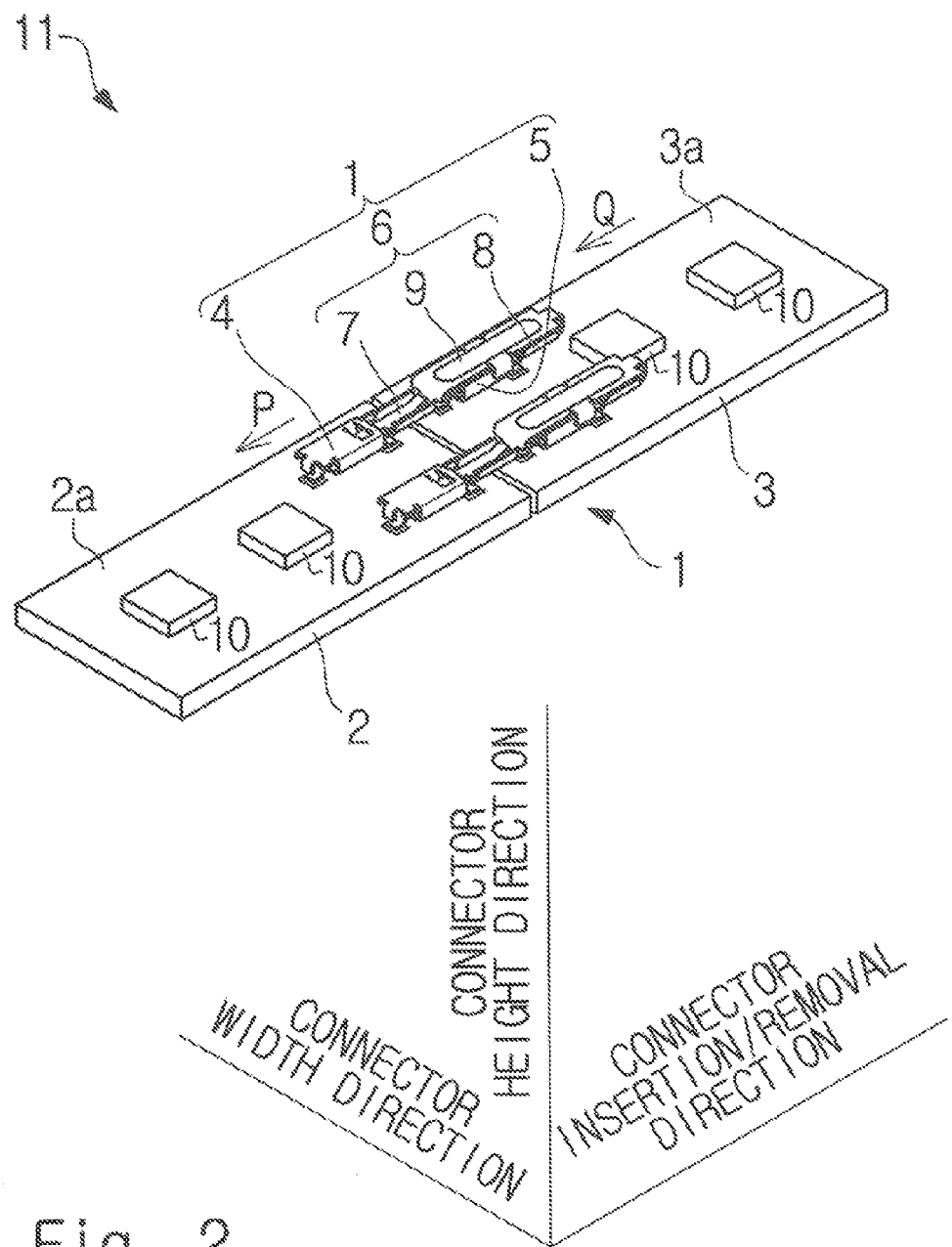
FIG. 2 is a perspective view of the connector assembly during mating of the connectors.
Figure 3:
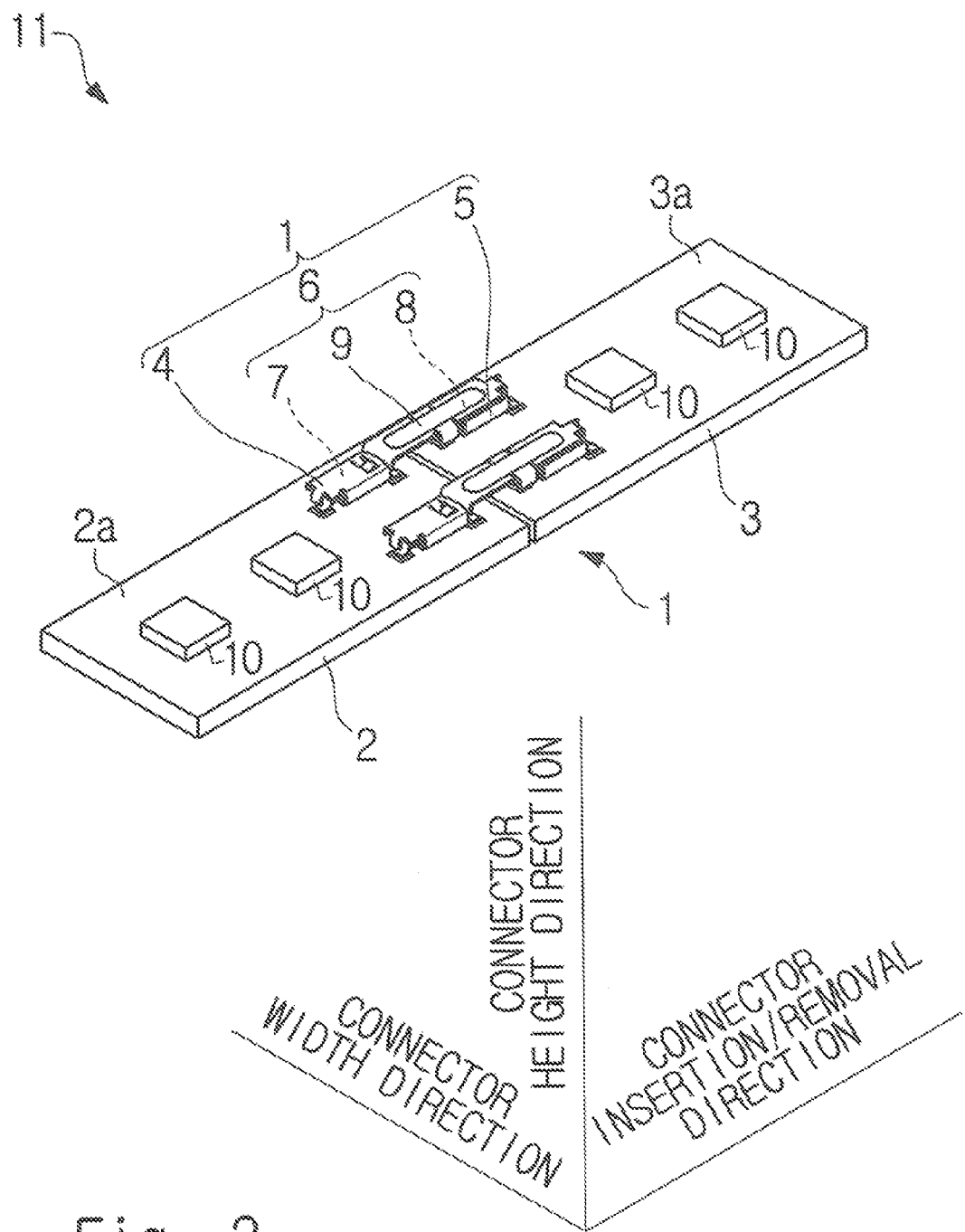
FIG. 3 is a perspective view of the connector assembly after mating of the connectors.

As shown in FIGS. 1 to 3, a connector assembly 1 connects a first substrate 2 having a first connector mounting surface 2a and a second substrate 3 having a second connector mounting surface 3a to each other in a state where the first connector mounting surface 2a and the second connector mounting surface 3a are substantially parallel to each other and the first substrate 2 and the second substrate 3 are opposed to each other in a direction substantially parallel to the first connector mounting surface 2a. The connector assembly 1 includes a receptacle 4 (first connector) mounted on the first connector mounting surface 2a of the first substrate 2; a receptacle 5 (second connector) mounted on the second connector mounting surface 3a of the second substrate 3; and a relay connector 6 (third connector). The relay connector 6 includes a plug 7 (first connector portion) to be mated with the receptacle 4; a plug 8 (second connector portion) to be mated with the receptacle 5; and a handle 9 (coupling portion) that couples the plug 7 and the plug 8 to each other.

As shown in FIGS. 1 to 3, the plug 7 is mated to the receptacle 4 in the direction parallel to the first connector mounting surface 2a of the first substrate 2. The plug 7 is moved in the direction parallel to the first connector mounting surface 2a of the first substrate 2, and is thereby mated with the receptacle 4. The plug 7 is moved in the direction parallel to the first connector mounting surface 2a of the first substrate 2 and inserted into the receptacle 4, and is thereby mated with the receptacle 4. Similarly, the plug 8 is mated to the receptacle 5 in the direction parallel to the second connector mounting surface 3a of the second substrate 3. The plug 8 is moved in a direction parallel to the second connector mounting surface 3a of the second substrate 3, and is thereby mated with the receptacle 5. The plug 8 is moved in the direction parallel to the second connector mounting surface 3a of the second substrate 3 and inserted into the receptacle 5, and is thereby mated with the receptacle 5.

Further, the plug 7 and the plug 8 are respectively mated with the receptacle 4 and the receptacle 5, so that the first substrate 2 and the second substrate 3 are electrically and mechanically connected by the connector assembly 1.

As shown in FIG. 2, a direction in which the receptacle 4 is mated to the plug 7 is defined as a first mating direction P. Similarly, a direction in which the receptacle 5 is mated to the plug 8 is defined as a second mating direction Q. In this embodiment, the first mating direction P and the second mating direction Q are substantially the same direction.

As shown in FIGS. 1 to 3, in this embodiment, two connector assemblies 1 are used to connect the first substrate 2 and the second substrate 3 to each other. The two connector assemblies 1 are used in such a manner that they are arranged side by side. Since the structure and operation of the two connector assemblies 1 are the same, only one of the connector assemblies 1 will be described and the description of the other one of the connector assemblies 1 will be omitted.

The terms "connector insertion/removal direction", "connector height direction", and "connector width direction" are herein defined. The "connector insertion/removal direction", "connector height direction", and "connector width direction" are defined below in association with the connector assembly 1. As shown in FIGS. 2 and 3, the "connector insertion/removal direction" is a direction in which the plug 7 is inserted into or removed from the receptacle 4. The "connector insertion/removal direction" includes "insertion direction" and "removal direction". The "insertion direction" is a direction in which the plug 7 is inserted into the receptacle 4. In this embodiment, the first mating direction P and the second mating direction Q are the same direction. Accordingly, the "insertion direction" is a direction in which the plug 7 is inserted into the receptacle 4, and is also a direction in which the plug 8 is inserted into the receptacle 5. The first mating direction P, the second mating direction Q, and the insertion direction are the same direction. The "removal direction" is a direction in which the plug 7 is removed from the receptacle 4, and is also a direction in which the plug 8 is removed from the receptacle 5. The "connector height direction" is a direction orthogonal to the first connector mounting surface 2a of the first substrate 2 on which the receptacle 4 is mounted, and is also a direction orthogonal to the second connector mounting surface 3a of the second substrate 3 on which the receptacle 5 is mounted. The "connector height direction" includes "mounting surface approaching direction" and "mounting surface separating direction". The "mounting surface approaching direction" is a direction approaching the first connector mounting surface 2a of the first substrate 2, or the second connector mounting surface 3a of the second substrate 3. The "mounting surface separating direction" is a direction separating from the first connector mounting surface 2a of the first substrate 2, or from the second connector mounting surface 3a of the second substrate 3. The "connector width direction" is a direction orthogonal to both the "connector insertion/removal direction" and the "connector height direction".

(First Substrate 2 and Second Substrate 3)

As shown in FIGS. 1 to 3, the first substrate 2 is formed so as to be elongated along the connector insertion/removal direction. A plurality of LEDs 10 are mounted on the first connector mounting surface 2a of the first substrate 2. The plurality of LEDs 10 are arranged at predetermined intervals along the connector insertion/removal direction. Similarly, the second substrate 3 is formed so as to be elongated along the connector insertion/removal direction. A plurality of LEDs 10 are mounted on the second connector mounting surface 3a of the second substrate 3. The plurality of LEDs 10 are arranged at predetermined intervals along the connector insertion/removal direction. A light-emitting module 11 includes the first substrate 2 on which the plurality of LEDs 10 are mounted, the second substrate 3 on which the plurality of LEDs 10 are mounted, and the two connector assemblies 1 that connect the first substrate 2 and the second substrate 3 to each other. The light-emitting module 11 is accommodated in an optically transparent cylindrical body which is not shown. Next-generation lighting equipment that replaces the existing fluorescent lighting can be implemented by the optically transparent cylindrical body and the light-emitting module 11.

(Receptacle 4: FIGS. 4 to 9)

Referring next to FIGS. 4 to 9, the receptacle 4 and the receptacle 5 will be described. Since the structure and operation of the receptacle 4 are the same as those of the receptacle 5, only the receptacle 4 will be described and the description of the receptacle 5 will be omitted.

As shown in FIGS. 4 to 9, the receptacle 4 includes an accommodating portion 12, a pair of mounting portions 13, and a guide piece 14 (accommodation guide piece). The receptacle 4 is formed of a metallic plate. The receptacle 4 is formed by plate bending.

(Receptacle 4: Accommodating Portion 12)

Figure 4:
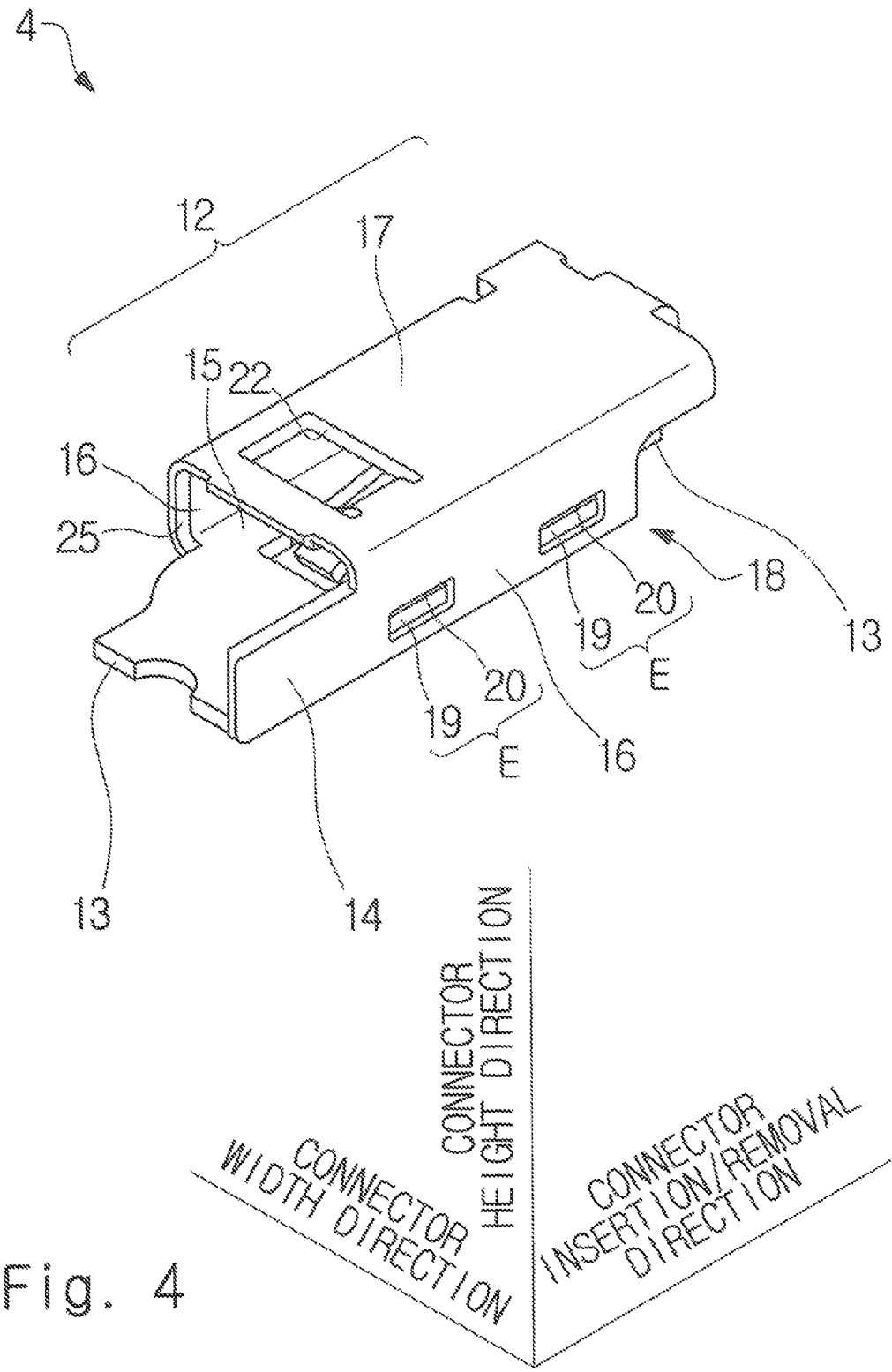
FIG. 4 is a first perspective view of a receptacle.

As shown in FIG. 4, the accommodating portion 12 is formed into a substantially rectangular tubular shape. Specifically, the accommodating portion 12 includes a bottom plate 15, a pair of side plates 16, and a top plate 17. In other words, the peripheral wall of the accommodating portion 12 is formed of the bottom plate 15, the pair of side plates 16, and the top plate 17. The bottom plate 15 and the top plate 17 are opposed to each other in the connector height direction. The paired side plates 16 are opposed to each other in the connector width direction.

Two shape retaining mechanisms E are formed at a joint 18 between the bottom plate 15 and one of the side plates 16. Each of the shape retaining mechanisms E is a mechanism for retaining the shape of the accommodating portion 12 having a substantially rectangular tubular shape. Each of the shape retaining mechanisms E is implemented by a shape retaining protrusion 19 formed on the bottom plate 15, and a shape retaining protrusion accommodating hole 20 (shape retaining protrusion accommodating portion) formed on the corresponding side plate 16. In this structure, the shape retaining protrusion 19 is accommodated in the shape retaining protrusion accommodating hole 20, thereby retaining the shape of the accommodating portion 12 having a substantially rectangular tubular shape.

Figure 5:
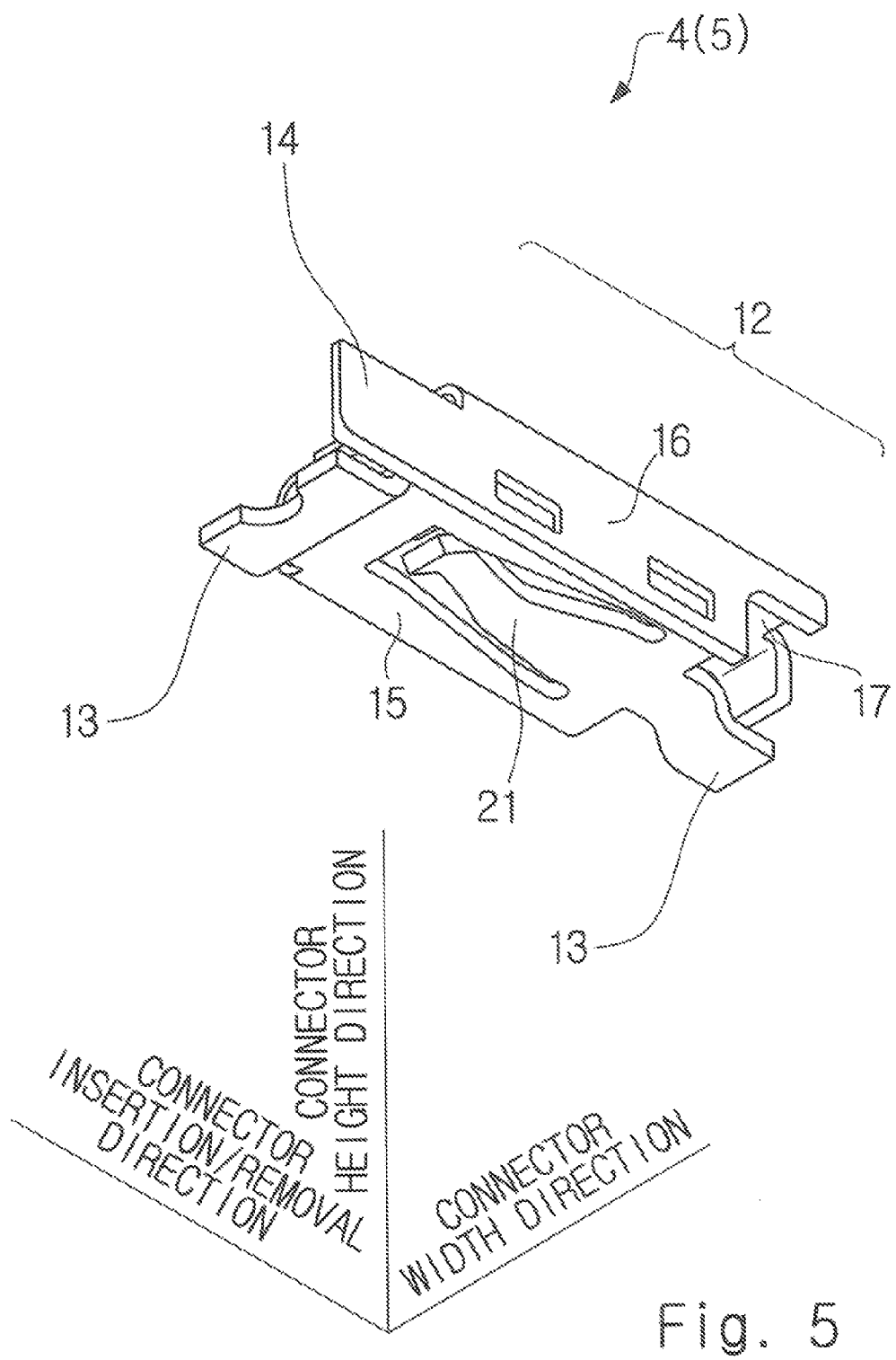
FIG. 5 is a second perspective view of the receptacle.
Figure 7:
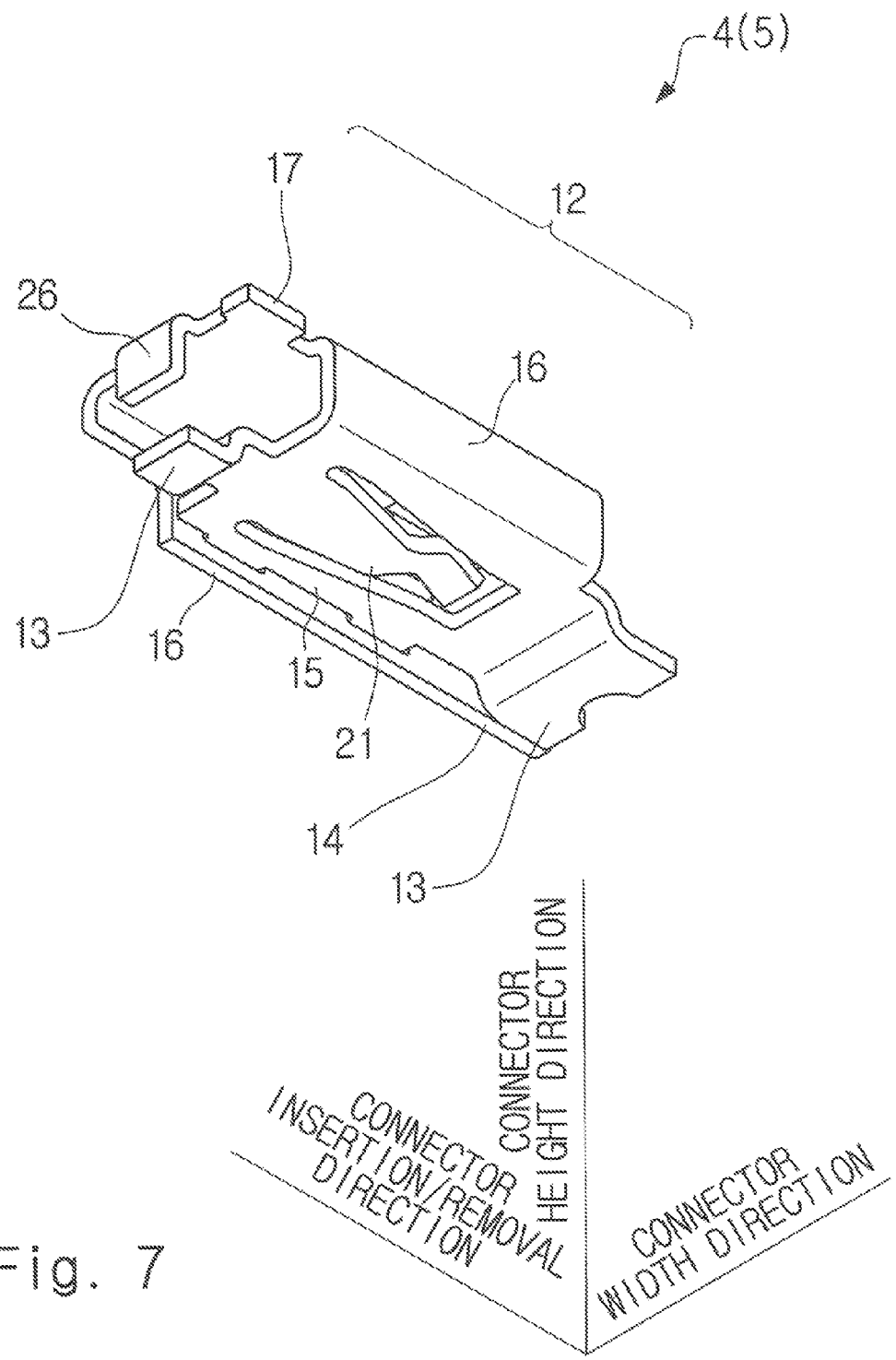
FIG. 7 is a fourth perspective view of the receptacle.
Figure 8:
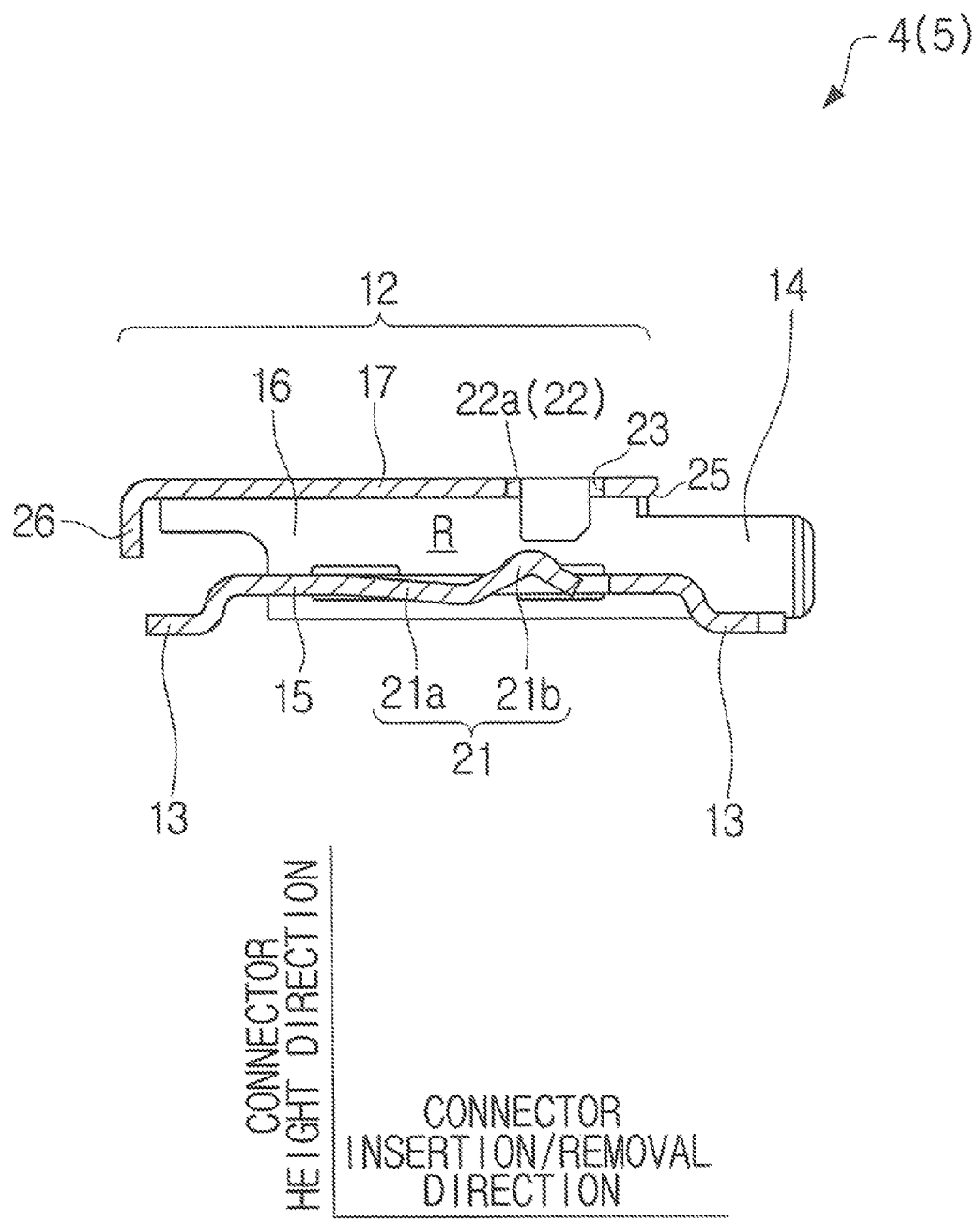
FIG. 8 is a sectional view taken along a line VIII-VIII of FIG. 6.

As shown in FIGS. 5, 7, and 8, a cantilever-shaped contact spring piece 21 is formed on the bottom plate 15. As shown in FIGS. 5 and 7, the contact spring piece 21 is formed by lancing from a central portion of the bottom plate 15. As shown in FIG. 8, the contact spring piece 21 includes a support spring piece 21a supported by the bottom plate 15 in a cantilever manner, and a contact portion 21b formed at a free end of the support spring piece 21a. The contact portion 21b protrudes in an internal space R of the accommodating portion 12 in a non-load state of the contact spring piece 21 shown in FIG. 8.

Figure 6:
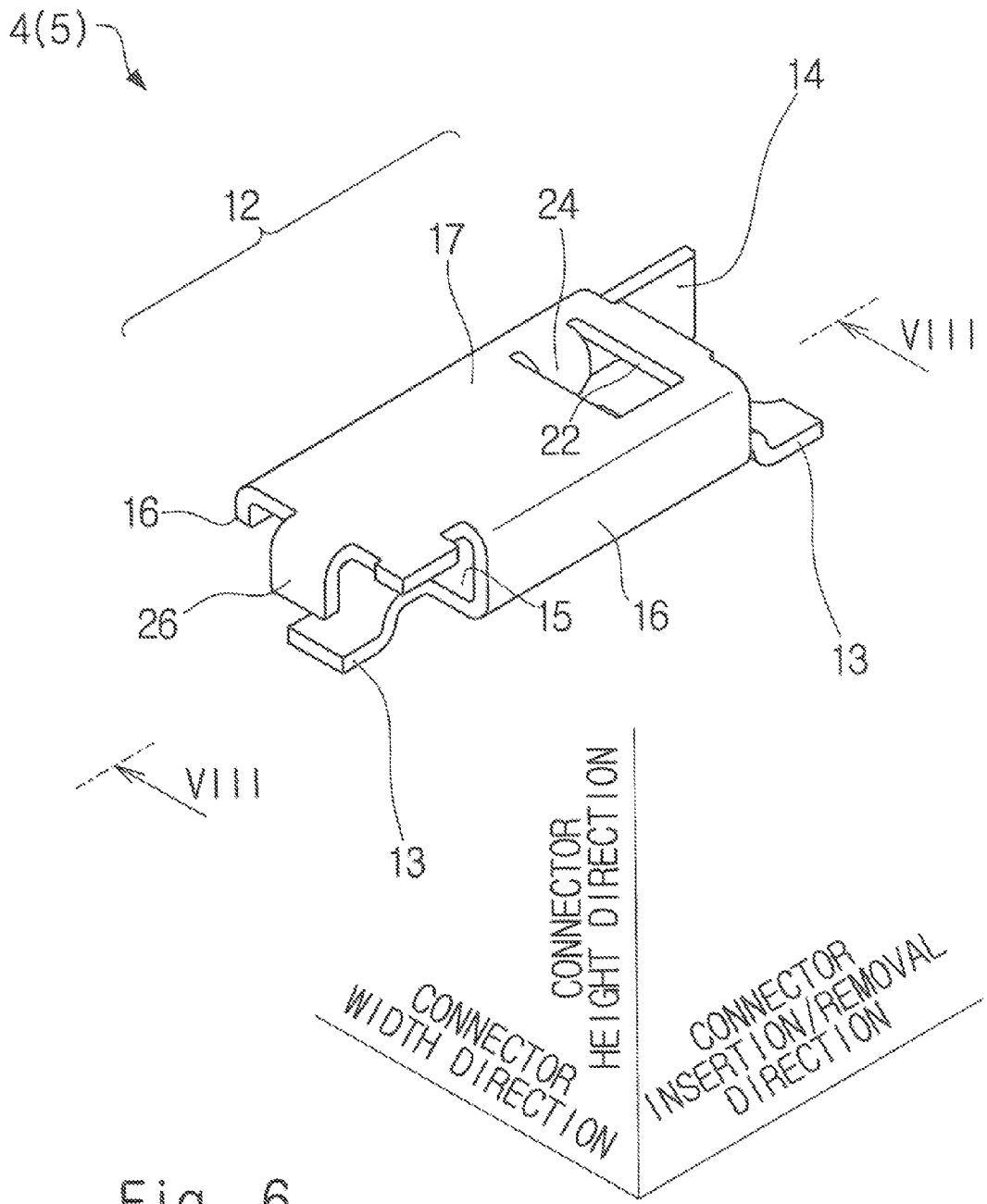
FIG. 6 is a third perspective view of the receptacle.
Figure 9:
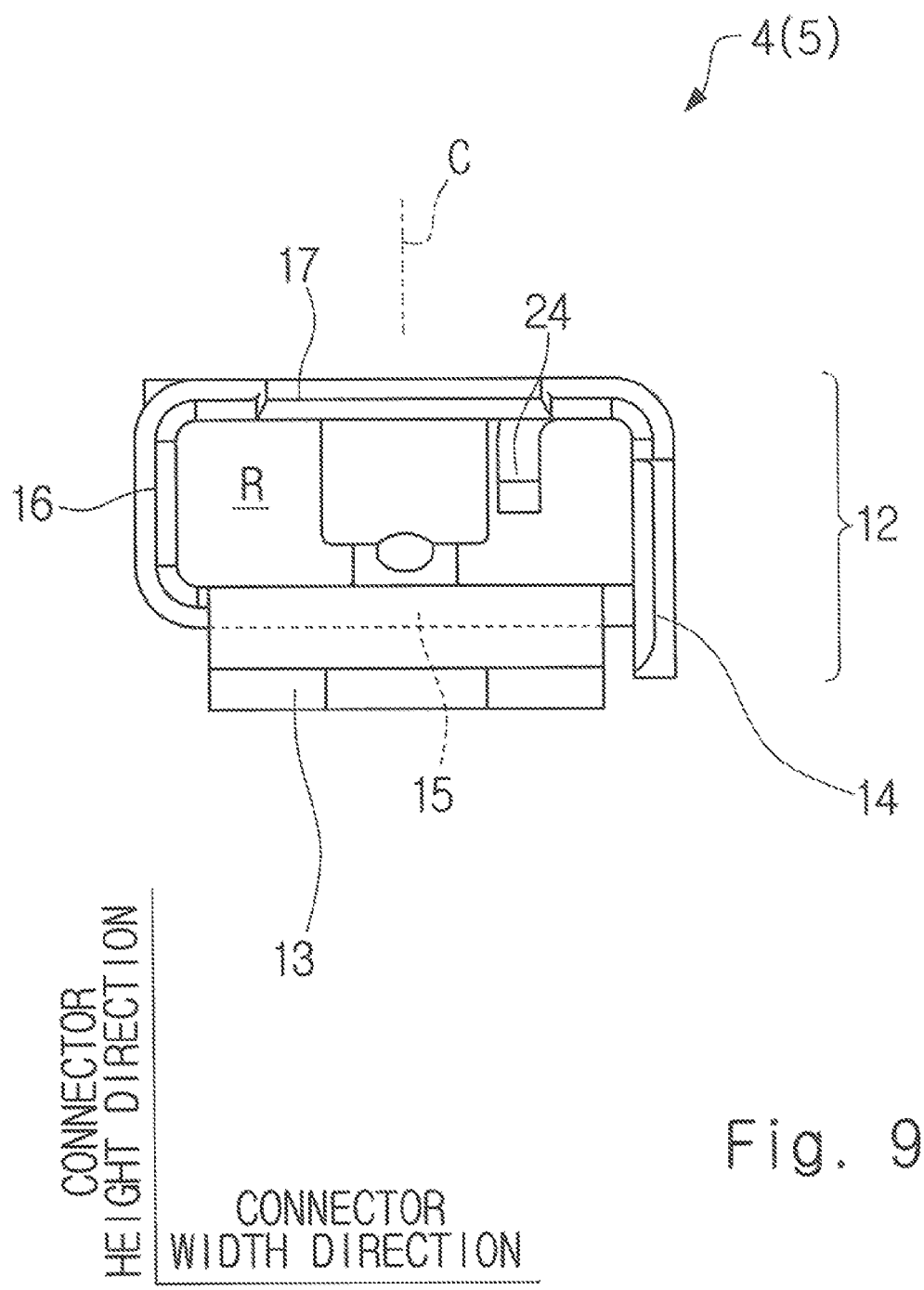
FIG. 9 is a front view of the receptacle.

As shown in FIGS. 4, 6, and 8, a lock hole 22 having a substantially rectangular shape is formed in the top plate 17. As shown in FIG. 8, the lock hole 22 is disposed so as to be substantially opposed to the contact portion 21b of the contact spring piece 21 in the connector height direction. An engaging surface 23 (engaging portion) which is a surface facing in the insertion direction is formed on an inner peripheral surface 22a of the lock hole 22. As shown in FIGS. 6 and 9, a key 24 (improper insertion prevention protrusion) is formed on the top plate 17. The key 24 is connected to the top plate 17 and protrudes in the mounting surface approaching direction in the internal space R as shown in FIG. 9. As shown in FIG. 6, the key 24 is formed by lancing during formation of the lock hole 22. As shown in FIG. 9, the key 24 is formed at a position shifted in the connector width direction from a center line C of the accommodating portion 12 in the connector width direction.

As shown in FIGS. 4 and 8, a guide chamfering 25 is formed at an open end of the accommodating portion 12 through which the plug 7 or the plug 8 is inserted. As shown in FIGS. 6 to 8, a blocking plate 26 is formed at an open end of the accommodating portion 12 that is opposite to the open end through which the plug 7 is inserted. In other words, the open end of the accommodating portion 12 that is opposite to the open end through which the plug 7 is inserted is blocked by the blocking plate 26. As shown in FIGS. 6 to 8, the blocking plate 26 is formed so as to protrude from the top plate 17 in the mounting surface approaching direction.

(Receptacle 4: Mounting Portion 13)

As shown in FIGS. 4 to 9, the pair of mounting portions 13 is formed so as to protrude from the bottom plate 15 and is disposed so as to sandwich the bottom plate 15 in the connector insertion/removal direction.

(Receptacle 4: Guide Piece 14)

As shown in FIG. 4, the guide piece 14 is formed so as to protrude in the removal direction from the side plate 16 adjacent to the joint 18. The guide piece 14 is orthogonal to the connector width direction. The guide piece 14 guides the insertion of the plug 7 or the plug 8 into the accommodating portion 12.

(Relay Connector 6: FIGS. 10 to 14)

As described above, the relay connector 6 shown in FIGS. 10 and 11 includes the plug 7, the plug 8, and the handle 9. The relay connector 6 is formed of a metallic plate. The relay connector 6 is formed by plate bending.

(Plug 7)

Figure 12:
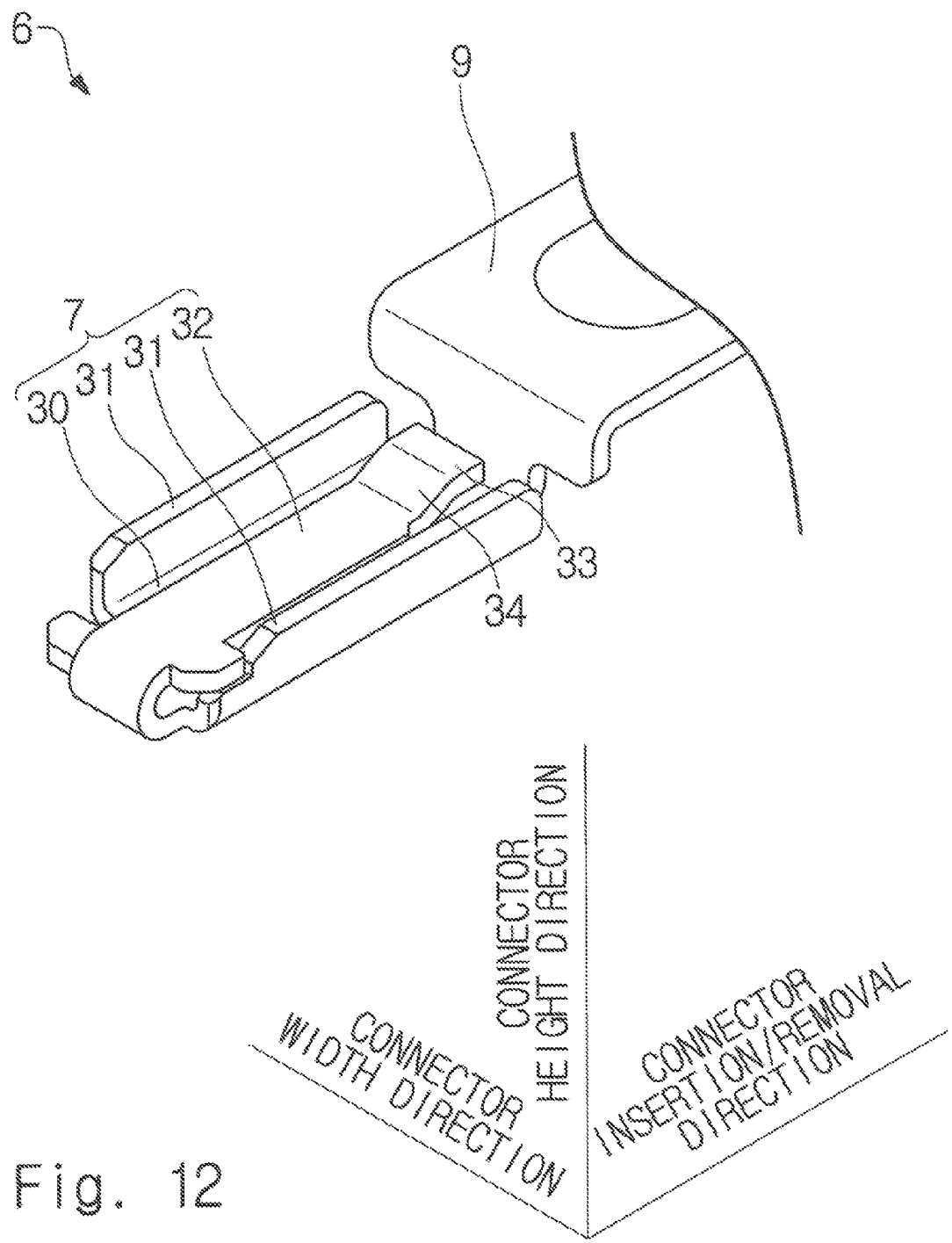
FIG. 12 is a partially enlarged view of FIG. 10.
Figure 13:
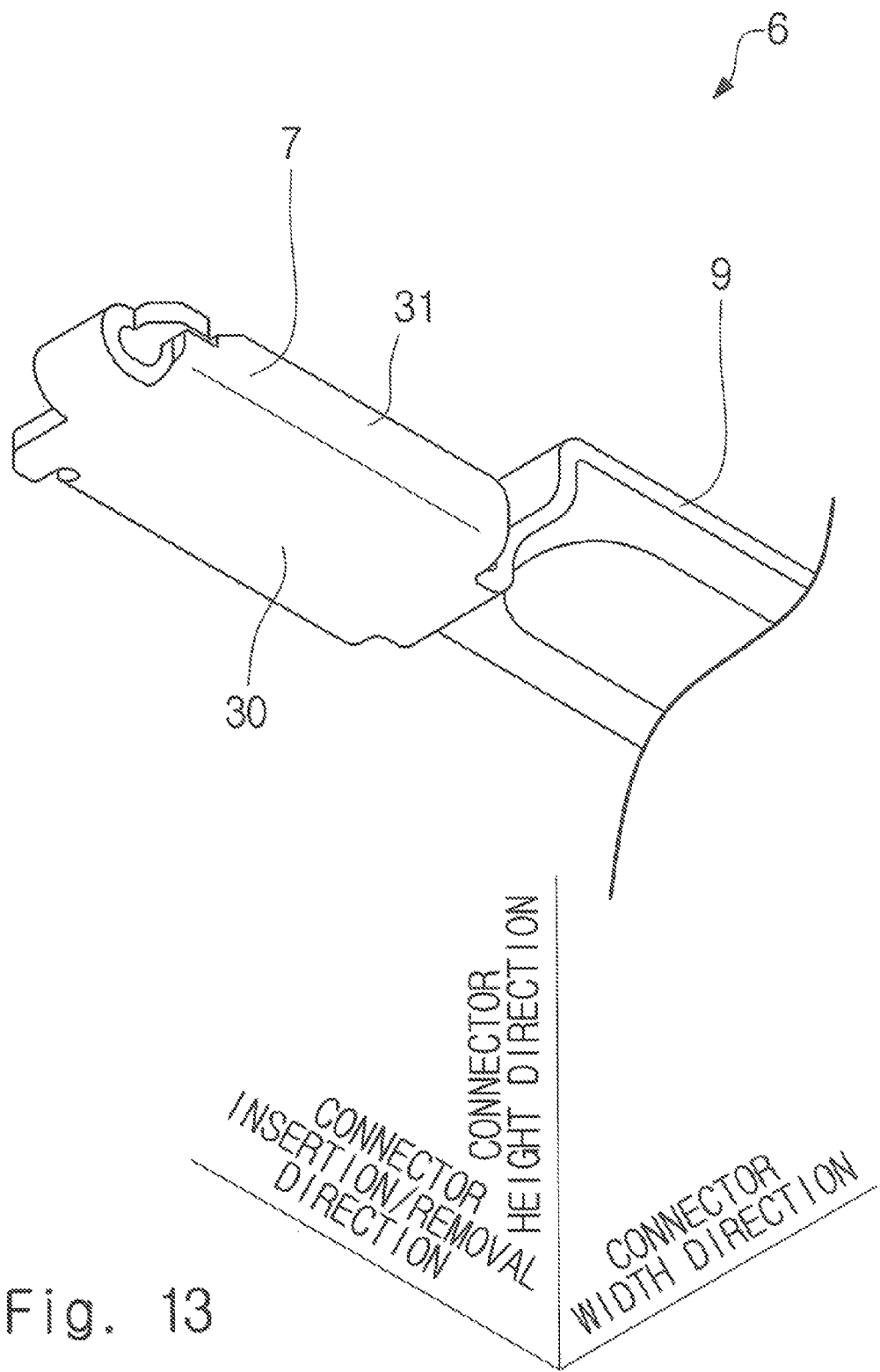
FIG. 13 is a partially enlarged view of FIG. 11.
Figure 14:
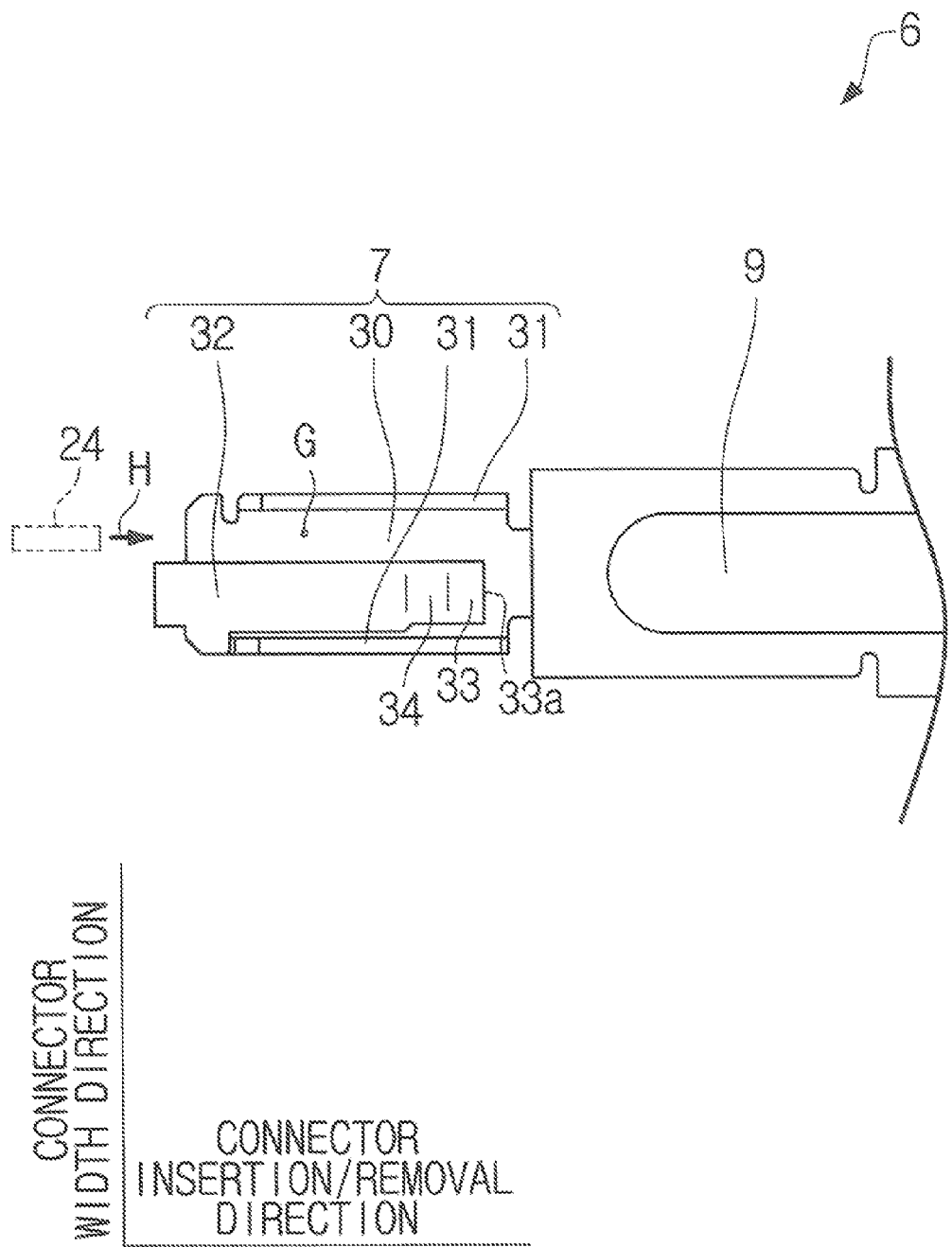
FIG. 14 is a partial plan view of the relay connector.
Figure 15:
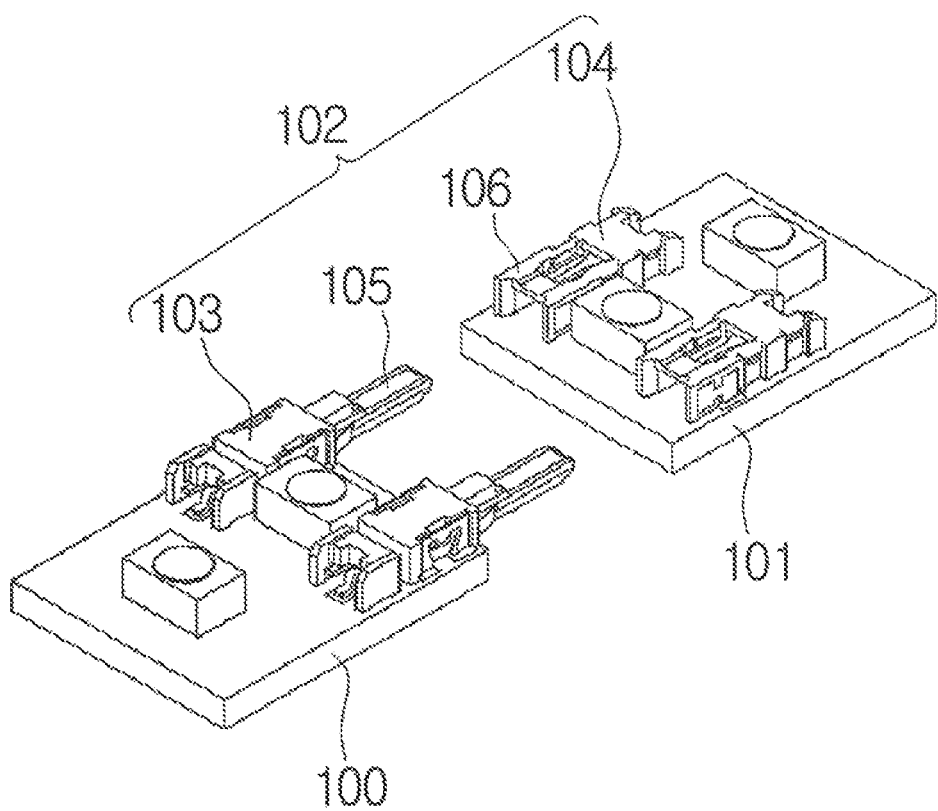
FIG. 15 is a diagram corresponding to FIG. 3 of Patent Literature 1.

As shown in FIGS. 12 and 13, the plug 7 is formed of a bottom plate 30, a pair of side plates 31, and a lock spring piece 32. The bottom plate 30 is formed so as to extend in the connector insertion/removal direction. The pair of side plates 31 are disposed so as to sandwich the bottom plate 30 in the connector width direction. The pair of side plates 31 is formed so as to protrude from the bottom plate 30 in the mounting surface separating direction. The pair of side plates 31 is opposed to each other in the connector width direction. Thus, the bottom plate 30 and the pair of side plates 31 form a substantially U-shape when viewed along the connector insertion/removal direction. The lock spring piece 32 is a cantilever-shaped spring piece supported by the bottom plate 30. The lock spring piece 32 is formed so as to extend in the removal direction from a leading end of the bottom plate 30 in the insertion direction. The lock spring piece 32 is disposed between the pair of side plates 31. Accordingly, as shown in FIG. 14, the bottom plate 30 and the lock spring piece 32 overlap each other when viewed along the connector height direction. The lock spring piece 32 is disposed at a position closer to one of the pair of side plates 31, and a key insertion gap G is formed between the lock spring piece 32 and the other one of the pair of side plates 31. As shown in FIG. 12, a claw portion 33 that slightly protrudes in the mounting surface separating direction is formed at a leading end of the lock spring piece 32 in the removal direction. As shown in FIG. 14, a tip surface 33a of the claw portion 33 in the removal direction faces in the connector insertion/removal direction in a non-load state of the lock spring piece 32. As shown in FIG. 12, since the claw portion 33 is formed at the lock spring piece 32 in such a manner that the claw portion 33 slightly protrudes in the mounting surface separating direction, an inclined guide surface 34 that extends toward the mounting surface approaching direction as it extends towards the insertion direction is formed on the insertion direction side as viewed from the claw portion 33.

(Plug 8)

As shown in FIG. 11, the plug 8 includes the bottom plate 30 and the pair of side plates 31. In other words, the plug 8 has a structure in which the lock spring piece 32, the claw portion 33, and the inclined guide surface 34 are removed from the plug 7.

(Handle 9)

Figure 10:
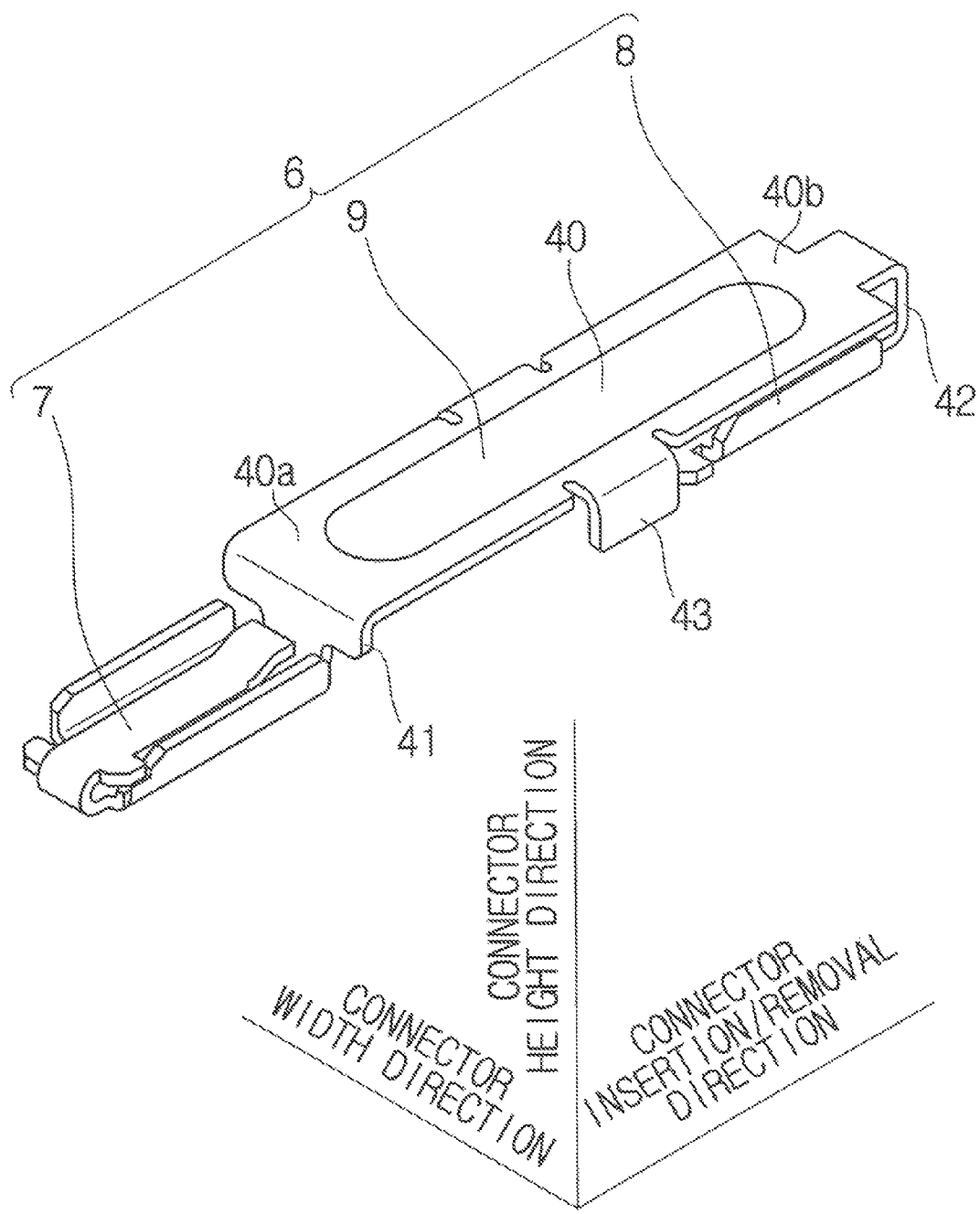
FIG. 10 is a perspective view of a relay connector.

As shown in FIGS. 10 and 11, the handle 9 includes a handle main body 40 (coupling portion main body), a first plug connecting portion 41, a second plug connecting portion 42, and a pair of insertion guide pieces 43 (communication guide pieces). The handle main body 40 is elongated and extends along the connector insertion/removal direction. The thickness direction of the handle main body 40 coincides with the connector height direction. The handle main body 40 has a leading end 40a and a trailing end 40b. The leading end 40a is a leading end of the handle main body 40 in the insertion direction. The trailing end 40b is a trailing end of the handle main body 40 in the insertion direction. The first plug connecting portion 41 is formed so as to protrude from the leading end 40a of the handle main body 40 in the mounting surface approaching direction. The second plug connecting portion 42 is formed so as to protrude from the trailing end 40b of the handle main body 40 in the mounting surface approaching direction. The pair of insertion guide pieces 43 is formed so as to protrude in the mounting surface approaching direction from both of the ends of the handle main body 40 in the connector width direction. The pair of insertion guide pieces 43 is disposed at the center of the handle main body 40 in the connector insertion/removal direction. The paired insertion guide pieces 43 are opposed to each other in the connector width direction. The paired insertion guide pieces 43 are opposed to each other in a direction orthogonal to the longitudinal direction of the handle main body 40. The paired insertion guide pieces 43 are opposed to each other in a direction orthogonal to the connector insertion/removal direction.

The plug 7 is formed so as to protrude in the insertion direction from the leading end 40a of the handle main body 40 of the handle 9 through the first plug connecting portion 41. The plug 8 is formed so as to protrude in the insertion direction from the trailing end 40b of the handle main body 40 of the handle 9 through the second plug connecting portion 42.

As shown in FIG. 10, the plug 8 is disposed on the mounting surface approaching direction side as viewed from the handle main body 40. In other words, the plug 8 is located between the handle main body 40 and the second substrate 3 in the state where the first substrate 2 and the second substrate 3 are connected to each other by the connector assembly 1. Accordingly, when the first substrate 2 and the second substrate 3 are connected to each other by the connector assembly 1, the plug 8 is hidden behind the handle main body 40 and thus is slightly hard to see.

(Usage)

Next, the usage of the connector assembly 1 will be described.

First, as shown in FIG. 1, the pair of mounting portions 13 of the receptacle 4 shown in FIG. 5 is soldered to the first connector mounting surface 2a of the first substrate 2. The receptacle 5 is also soldered to the second connector mounting surface 3a of the second substrate 3.

Next, as shown in FIG. 1, the first substrate 2 and the second substrate 3 are fixed with a double-sided tape or the like onto a substrate support plate, which is not shown, of the light-emitting module 11. The first substrate 2 and the second substrate 3 are fixed so as to be adjacent to each other in the connector insertion/removal direction. In this state, the receptacle 4 and the receptacle 5 which constitute the connector assembly 1 face in the same direction.

As shown in FIG. 1, the relay connector 6 electrically and mechanically couples the receptacle 4 and the receptacle 5 to each other in the state where the first substrate 2 and the second substrate 3 are fixed in the light-emitting module 11. As shown in FIG. 1, the relay connector 6 electrically and mechanically couples the receptacle 4 and the receptacle 5 to each other in the state where the receptacle 4 mounted on the first connector mounting surface 2a of the first substrate 2 and the receptacle 5 mounted on the second connector mounting surface 3a of the second substrate 3 are positioned in the light-emitting module 11.

Specifically, the plug 7 of the relay connector 6 is disposed on the removal direction side of the receptacle 4, and the plug 8 of the relay connector 6 is disposed on the removal direction side of the receptacle 5. At the same time, the handle main body 40 of the handle 9 of the relay connector 6 shown in FIG. 10 is placed on the top plate 17 of the accommodating portion 12 of the receptacle 5 shown in FIG. 6. Then, the paired insertion guide pieces 43 of the handle 9 of the relay connector 6 shown in FIG. 10 sandwich the accommodating portion 12 of the receptacle 5 shown in FIG. 6 in the connector width direction. Thus, the displacement of the relay connector 6 in the connector insertion/removal direction with respect to the receptacle 5 is allowed, while the displacement of the relay connector 6 in the connector width direction with respect to the receptacle 5 is inhibited.

In this state, as shown in FIGS. 2 and 3, the relay connector 6 is moved in the insertion direction. Then, the plug 7 of the relay connector 6 is inserted into the accommodating portion 12 of the receptacle 4 and is mated with the receptacle 4, and the plug 8 of the relay connector 6 is inserted into the accommodating portion 12 of the receptacle 5 and is mated with the receptacle 5.

At this time, the plug 7 of the relay connector 6 depresses the contact spring piece 21 of the accommodating portion 12 of the receptacle 4 shown in FIG. 8 in the mounting surface approaching direction. Also, at this time, the lock spring piece 32 of the plug 7 shown in FIG. 12 is depressed in the mounting surface approaching direction due to the interaction between the inclined guide surface 34 of the lock spring piece 32 of the plug 7 and the guide chamfering 25 of the accommodating portion 12 shown in FIG. 4. After that, when the claw portion 33 of the lock spring piece 32 of the plug 7 shown in FIG. 12 reaches the lock hole 22 of the top plate 17 of the accommodating portion 12 of the receptacle 4 shown in FIG. 6, the claw portion 33 of the lock spring piece 32 is moved into the lock hole 22 by the self elastic restoring force of the lock spring piece 32. This movement allows the tip surface 33a of the claw portion 33 of the lock spring piece 32 of the plug 7 shown in FIG. 14 to be opposed to the engaging surface 23 of the lock hole 22 of the accommodating portion 12 of the receptacle 4 shown in FIG. 8 in the connector insertion/removal direction. This opposed relationship in the connector insertion/removal direction inhibits the plug 7 from being removed from the receptacle 4.

At this time, the plug 8 of the relay connector 6 depresses the contact spring piece 21 of the accommodating portion 12 of the receptacle 4 shown in FIG. 8 in the mounting surface approaching direction.

In this manner, when the plug 7 of the relay connector 6 is mated with the receptacle 4 and the plug 8 of the relay connector 6 is mated with the receptacle 5, the connector assembly 1 electrically and mechanically connects the first substrate 2 and the second substrate 3 to each other as shown in FIG. 3.

The conduction between the plug 7 and the receptacle 4 is achieved at all contact points where the plug 7 and the receptacle 4 are in contact with each other. However, in addition to this, in this embodiment, the contact portion 21b of the contact spring piece 21 is brought into powerful contact with the bottom plate 30 of the plug 7 shown in FIG. 13 by the self elastic restoring force of the contact spring piece 21 shown in FIG. 8 in the state where the plug 7 and the receptacle 4 are mated with each other. This contact ensures a reliable conduction between the plug 7 and the receptacle 4. The same holds true for the conduction between the plug 8 and the receptacle 5.

In the case of inserting the plug 7 into the accommodating portion 12 of the receptacle 4, the key 24 of the receptacle 4 shown in FIG. 9 is inserted into the key insertion gap G formed between the lock spring piece 32 and the side plate 31 as indicated by a bold arrow H in FIG. 14. Accordingly, in general, the presence of the key 24 of the receptacle 4 does not interfere with the insertion of the plug 7 into the accommodating portion 12 of the receptacle 4. However, if the plug 7 is to be inserted into the accommodating portion 12 of the receptacle 4 at an improper position, the key 24 of the receptacle 4 physically interferes with the bottom plate 30 and the like. Therefore, if the plug 7 is to be inserted into the accommodating portion 12 of the receptacle 4 at an improper position, the presence of the key 24 of the receptacle 4 inhibits the insertion of the plug 7 into the accommodating portion 12 of the receptacle 4.

The blocking plate 26 of the receptacle 4 shown in FIG. 6 prevents the plug 7 from being inserted into the accommodating portion 12 of the receptacle 4 in an improper direction.

In order to remove the plug 7 from the receptacle 4 mated with the plug 7, the claw portion 33 of the plug 7 may be depressed in the mounting surface approaching direction by using a jig having a sharpened tip. This results in releasing the opposed relationship between the tip surface 33a of the claw portion 33 of the plug 7 shown in FIG. 14 and the engaging surface 23 of the lock hole 22 of the accommodating portion 12 of the receptacle 4 shown in FIG. 8 in the connector insertion/removal direction. During the period in which the opposed relationship is released, the removal of the plug 7 from the receptacle 4 is allowed. The plug 8 can be removed from the receptacle 5 mated with the plug 8 without the need for any special operation. Accordingly, when the plug 7 is operated to remove the plug 7 from the receptacle 4, the plug 8 is simultaneously removed from the receptacle 5.

In sum, the first preferred embodiment of the present invention described above has the following features.

(1) The connector assembly 1 connects the first substrate 2 having the first connector mounting surface 2a and the second substrate 3 having the second connector mounting surface 3a to each other in such a manner that the first connector mounting surface 2a and the second connector mounting surface 3a are substantially parallel to each other. The connector assembly 1 includes the receptacle 4 (first connector) mounted on the first connector mounting surface 2a of the first substrate 2; the receptacle 5 (second connector) mounted on the second connector mounting surface 3a; and the relay connector 6 (third connector). The relay connector 6 includes the plug 7 (first connector portion) to be mated with the receptacle 4 in a direction parallel to the first connector mounting surface 2a; the plug 8 (second connector portion) to be mated with the receptacle 5 in a direction parallel to the second connector mounting surface 3a; and the handle 9 (coupling portion) that couples the plug 7 and the plug 8 to each other. The relay connector 6 is structured in such a manner that the first mating direction P in which the plug 7 is mated to the receptacle 4 is substantially the same as the second mating direction Q in which the plug 8 is mated to the receptacle 5. The above structure facilitates handling of the connector assembly 1, which connects one substrate to another substrate, prior to mating of the connectors, while achieving a low profile and strong holding power of the connector assembly 1.

Note that the relay connector 6 is structured in such a manner that the first mating direction P in which the plug 7 is mated to the receptacle 4 is substantially the same as the second mating direction Q in which the plug 8 is mated to the receptacle 5. Accordingly, as shown in FIG. 1, the first substrate 2 and the second substrate 3 can be electrically and mechanically connected to each other even under the condition in which the relative positional relationship between the first substrate 2 and the second substrate 3 is restricted.

(2) The relay connector 6 includes the handle main body 40 (coupling portion main body) that is elongated and extends in the first mating direction P. The plug 7 is formed so as to protrude in the first mating direction P from the leading end 40a of the handle main body 40 in the first mating direction P. The plug 8 is formed so as to protrude in the first mating direction P from the trailing end 40b of the handle main body 40 in the first mating direction P. According to the above structure, the relay connector 6 where the first mating direction P and the second mating direction Q are the same direction can be achieved with a simple structure.

(3) The plug 8 is located between the handle main body 40 and the second substrate 3 in a state where the first substrate 2 and the second substrate 3 are connected to each other by the connector assembly 1.

(4) The receptacle 5 includes the accommodating portion 12 having a tubular shape and extending along the first mating direction P. The plug 8 is inserted into the accommodating portion 12 of the receptacle 5, and is thereby mated with the receptacle 5.

(5) The relay connector 6 includes a pair of insertion guide pieces 43 (communication guide pieces) that sandwich the accommodating portion 12 of the receptacle 5 prior to the insertion of the plug 8 into the receptacle 5, so as to guide the insertion of the plug 8 into the receptacle 5. According to the above structure, in the case of inserting the plug 8 into the accommodating portion 12 of the receptacle 5, the insertion of the plug 8 into the receptacle 5 is guided. This facilitates the insertion of the plug 8 into the accommodating portion 12 of the receptacle 5.

(6) The pair of insertion guide pieces 43 is formed so as to protrude toward the second substrate 3 from the handle main body 40. According to the above structure, the pair of insertion guide pieces 43 can be achieved with a simple structure.

(7) The receptacle 4 and the relay connector 6 are each formed of a metal. The receptacle 4 includes the tubular accommodating portion 12 in which the plug 7 of the relay connector 6 is inserted. The claw portion 33 is formed at the plug 7 of the relay connector 6. The engaging surface 23 (engaging portion) that engages with the claw portion 33 is formed at the accommodating portion 12 of the receptacle 4. The plug 7 of the relay connector 6 is inserted into the accommodating portion 12 of the receptacle 4, thereby allowing the claw portion 33 to engage with the engaging surface 23. According to the above structure, even when the relay connector 6 is to be removed from the receptacle 4, the mated state of the connector assembly 1 can be maintained. Further, the receptacle 4 mounted on the first substrate 2 is stable while being soldered since the center of mass of the receptacle 4 is located on the first substrate 2, and the receptacle 5 mounted on the first substrate 3 is also stable while being soldered since the center of mass of the receptacle 5 is located on the second substrate 3.

(8) The plug 7 of the relay connector 6 includes the cantilever-shaped lock spring piece 32. The claw portion 33 is formed at the lock spring piece 32. According to the above structure, a large range of motion in which the claw portion 33 can be displaced is ensured.

(9) The plug 7 of the relay connector 6 includes a pair of side plates 31 opposed to each other.

(10) The lock spring piece 32 is formed between the pair of side plates 31. According to the above structure, the lock spring piece 32 can be protected from an external force.

(11) The lock spring piece 32 is disposed at a position closer to one of the pair of side plates 31. The key insertion gap G is formed between the lock spring piece 32 and the other one of the pair of side plates 31.

(12) The key 24 (improper insertion prevention protrusion) to be inserted into the key insertion gap G is formed at the accommodating portion 12. The above structure inhibits the insertion of the plug 7 of the relay connector 6 into the accommodating portion 12 of the receptacle 4 at an improper position.

(13) The key 24 is formed by lancing from a part of the top plate 17 which is a part of the peripheral wall of the accommodating portion 12. According to the above structure, the key 24 can be formed at a low cost.

(14) The lock hole 22 is formed on the top plate 17 which is a part of the peripheral wall of the accommodating portion 12. The engaging surface 23 is formed on the inner peripheral surface 22a of the lock hole 22. According to the above structure, the engaging surface 23 can be achieved with a simple structure.

(15) The key 24 is formed by lancing during formation of the lock hole 22. According to the above structure, the key 24 can be formed at a low cost.

(16) The blocking plate 26 is formed at an open end of the accommodating portion 12 of the receptacle 4, the open end being opposite to an open end of the accommodating portion 12 of the receptacle 4 through which the plug 7 of the relay connector 6 is inserted. The above structure inhibits the insertion of the plug 7 of the relay connector 6 into the accommodating portion 12 of the receptacle 4 in an improper direction.

(17) The accommodating portion 12 includes the cantilever-shaped contact spring piece 21.

(18) The shape retaining mechanism E that retains the shape of the tubular accommodating portion 12 is formed at the joint 18 of the accommodating portion 12 formed into a tubular shape by plate bending. The shape retaining mechanism E is implemented by the shape retaining protrusion 19 and the shape retaining protrusion accommodating hole 20 (shape retaining protrusion accommodating portion) in which the shape retaining protrusion 19 is accommodated. According to the above structure, the shape retaining mechanism E can be achieved with a simple structure.

(19) The accommodating portion 12 is formed into a rectangular tubular shape.

(20) The receptacle 4 further includes the guide piece 14 (accommodation guide piece) that guides the insertion of the plug 7 of the relay connector 6 into the accommodating portion 12. According to the above structure, the operation for inserting the plug 7 of the relay connector 6 into the accommodating portion 12 of the receptacle 4 can be simplified.

This application is based upon and claims the benefit of priority from Japanese patent application No. 2013-068639, filed on Mar. 28, 2013, the disclosure of which is incorporated herein in its entirety by reference.

REFERENCE SIGNS LIST

1 CONNECTOR ASSEMBLY
2 FIRST SUBSTRATE
2a FIRST CONNECTOR MOUNTING SURFACE
3 SECOND SUBSTRATE
3a SECOND CONNECTOR MOUNTING SURFACE
4 RECEPTACLE (FIRST CONNECTOR)
5 RECEPTACLE (SECOND CONNECTOR)
6 RELAY CONNECTOR (THIRD CONNECTOR)
7 PLUG (FIRST CONNECTOR PORTION)
8 PLUG (SECOND CONNECTOR PORTION)
9 HANDLE (COUPLING PORTION)
10 LED
11 LIGHT-EMITTING MODULE
12 ACCOMMODATING PORTION
13 MOUNTING PORTION
14 GUIDE PIECE (ACCOMMODATION GUIDE PIECE)
15 BOTTOM PLATE
16 SIDE PLATE
17 TOP PLATE
18 JOINT

19 SHAPE RETAINING PROTRUSION
20 SHAPE RETAINING PROTRUSION ACCOMMODATING HOLE (SHAPE RETAINING PROTRUSION ACCOMMODATING PORTION)
21 CONTACT SPRING PIECE
21a SUPPORT SPRING PIECE
21b CONTACT PORTION
22 LOCK HOLE
22a INNER PERIPHERAL SURFACE
23 ENGAGING SURFACE (ENGAGING PORTION)
24 KEY
25 GUIDE CHAMFERING
26 BLOCKING PLATE
30 BOTTOM PLATE
31 SIDE PLATE
32 LOCK SPRING PIECE
33 CLAW PORTION
33a TIP SURFACE
34 INCLINED GUIDE SURFACE
40 HANDLE MAIN BODY (COUPLING PORTION MAIN BODY)
40a LEADING END
40b TRAILING END
41 FIRST PLUG CONNECTING PORTION
42 SECOND PLUG CONNECTING PORTION
43 INSERTION GUIDE PIECE (COMMUNICATION GUIDE PIECE)
C CENTER LINE
E SHAPE RETAINING MECHANISM
G KEY INSERTION GAP
P FIRST MATING DIRECTION
Q SECOND MATING DIRECTION
R INTERNAL SPACE
H BOLD ARROW

The invention claimed is:

1. A connector assembly that connects a first substrate having a first connector mounting surface and a second substrate having a second connector mounting surface to each other in such a manner that the first connector mounting surface and the second connector mounting surface are substantially parallel to each other, the connector assembly comprising:
a first connector mounted on the first connector mounting surface of the first substrate;
a second connector mounted on the second connector mounting surface of the second substrate; and
a third connector comprising: a first connector portion to be mated with the first connector in a direction parallel to the first connector mounting surface; a second connector portion to be mated with the second connector in a direction parallel to the second connector mounting surface; and a coupling portion that couples the first connector portion and the second connector portion to each other, the third connector being structured in such a manner that a first mating direction in which the first connector portion is mated to the first connector is substantially the same as a second mating direction in which the second connector portion is mated to the second connector;
the third connector is a relay connector.

2. The connector assembly according to claim 1, wherein the coupling portion comprises a coupling portion main body that is elongated and extends in the first mating direction,
the first connector portion is formed so as to protrude in the first mating direction from a leading end of the coupling portion main body in the first mating direction, and
the second connector portion is formed so as to protrude in the first mating direction from a trailing end of the coupling portion main body in the first mating direction.

3. The connector assembly according to claim 2, wherein the second connector portion is located between the coupling portion main body and the second substrate in a state where the first substrate and the second substrate are connected to each other by the connector assembly.

4. The connector assembly according to claim 3, wherein the second connector comprises an accommodating portion having a tubular shape and extending along the first mating direction, and
the second connector portion is inserted into the accommodating portion of the second connector, and is thereby mated with the second connector.

5. The connector assembly according to claim 4, wherein the coupling portion comprises a pair of communication guide pieces that sandwich the accommodating portion of the second connector prior to the insertion of the second connector portion into the second connector, so as to guide the insertion of the second connector portion into the second connector.

6. The connector assembly according to claim 5, wherein the pair of communication guide pieces is formed so as to protrude toward the second substrate from the coupling portion main body.

7. The connector assembly according claim 1, wherein the first connector and the third connector are each formed of a metal,
the first connector includes a tubular accommodating portion into which the first connector portion of the third connector is inserted,
a claw portion is formed at the first connector portion of the third connector,
an engaging portion that engages with the claw portion is formed at the accommodating portion of the first connector, and
the first connector portion of the third connector is inserted into the accommodating portion of the first connector, thereby allowing the claw portion to engage with the engaging portion.

8. The connector assembly according to claim 7, wherein a blocking plate is formed at an open end of the accommodating portion of the first connector, the open end being opposite to an open end of the accommodating portion of the first connector through which the first connector portion of the third connector is inserted.

9. The connector assembly according to claim 7, wherein the accommodating portion of the first connector includes a cantilever-shaped contact spring piece.

10. The connector assembly according to claim 7, wherein a shape retaining mechanism that retains the shape of the tubular accommodating portion of the first connector is formed at a joint of the accommodating portion of the first connector formed into a tubular shape by plate bending, and
the shape retaining mechanism is implemented by a shape retaining protrusion and a shape retaining protrusion accommodating portion in which the shape retaining protrusion is accommodated.

11. The connector assembly according to claim 7, wherein the accommodating portion of the first connector is formed into a rectangular tubular shape.

12. The connector assembly according to claim 7, wherein the first connector further includes an accommodation guide piece that guides insertion of the first connector portion of the third connector into the accommodating portion of the first connector.

13. The connector assembly according to claim 7, wherein
the first connector portion of the third connector includes a cantilever-shaped lock spring piece, and
the claw portion is formed at the lock spring piece.

14. The connector assembly according to claim 13, wherein
the first connector portion of the third connector includes a pair of side plates opposed to each other.

15. The connector assembly according to claim 14, wherein the lock spring piece is formed between the pair of side plates.

16. The connector assembly according to claim 15, wherein
the lock spring piece is disposed at a position closer to one of the pair of side plates, and
a key insertion gap is formed between the lock spring piece and the other one of the pair of side plates.

17. The connector assembly according to claim 16, wherein an improper insertion prevention protrusion to be inserted into the key insertion gap is formed at the accommodating portion of the first connector.

18. The connector assembly according to claim 17, wherein the improper insertion prevention protrusion is formed by lancing from a part of a peripheral wall of the accommodating portion of the first connector.

19. The connector assembly according to claim 18, wherein
a lock hole is formed in the peripheral wall of the accommodating portion of the first connector, and
the engaging portion is formed on an inner peripheral surface of the lock hole.

20. The connector assembly according to claim 19, wherein the improper insertion prevention protrusion is formed by lancing during formation of the lock hole.

* * * * *